(12) United States Patent
Albrecht et al.

(10) Patent No.: US 7,817,695 B2
(45) Date of Patent: Oct. 19, 2010

(54) LATERAL OPTICALLY PUMPED SURFACE-EMITTING SEMICONDUCTOR LASER ON A HEAT SINK

(75) Inventors: Tony Albrecht, Bad Abbach (DE); Stephan Lutgen, Regensburg (DE); Wolfgang Reill, Pentling (DE); Thomas Schwarz, Regensburg (DE); Ulrich Steegmüller, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 441 days.

(21) Appl. No.: 11/663,617

(22) PCT Filed: Sep. 20, 2005

(86) PCT No.: PCT/DE2005/001655

§ 371 (c)(1),
(2), (4) Date: Feb. 4, 2008

(87) PCT Pub. No.: WO2006/032252

PCT Pub. Date: Mar. 30, 2006

(65) Prior Publication Data

US 2009/0201958 A1    Aug. 13, 2009

(30) Foreign Application Priority Data

Sep. 22, 2004    (DE)    ........................ 10 2004 045 949

(51) Int. Cl.
*H01S 5/00*    (2006.01)

(52) U.S. Cl. ........................ 372/50.124; 372/34; 372/36; 372/70

(58) Field of Classification Search ............ 372/50.124, 372/34, 36

See application file for complete search history.

(56) References Cited

U.S. PATENT DOCUMENTS

| | | | |
|---|---|---|---|
| 5,422,901 | A | 6/1995 | Lebby et al. |
| 5,991,318 | A | 11/1999 | Caprara et al. |

(Continued)

FOREIGN PATENT DOCUMENTS

| | | |
|---|---|---|
| CN | 1101987 C | 2/2003 |

(Continued)

OTHER PUBLICATIONS

Schraud et al., "Substrateless singlemode vertical cavity surface-emitting GaAs/GaAlAs laser diode", Electronics Letters, vol. 30, No. 3, pp. 238-239, Feb. 3, 1994.

*Primary Examiner*—Dung T Nguyen
(74) *Attorney, Agent, or Firm*—Cohen Pontani Lieberman & Pavane LLP (57) ABSTRACT

A surface emitting semiconductor laser device comprising at least one surface emitting semiconductor laser (21) having a vertical emitter (1) and at least one pump radiation source (2), which are monolithically integrated alongside one another onto a common substrate (13), is described. The semiconductor laser device additionally has a heat-conducting element (18), which is in thermal contact with the semiconductor laser (21) and has a mounting area provided for mounting on a carrier (27). Methods for producing such a surface emitting semiconductor laser device are furthermore described.

17 Claims, 4 Drawing Sheets

U.S. PATENT DOCUMENTS

| | | |
|---|---|---|
| 6,084,895 A | 7/2000 | Kouchi et al. |
| 6,423,561 B1 | 7/2002 | Chino et al. |
| 6,835,603 B2 | 12/2004 | Acklin et al. |
| 6,954,479 B2 | 10/2005 | Albrecht et al. |
| 2002/0176459 A1 | 11/2002 | Martinsen |
| 2004/0141538 A1 | 7/2004 | Schmid et al. |
| 2005/0025211 A1 | 2/2005 | Zhang et al. |
| 2005/0220165 A1 * | 10/2005 | Caprara et al. ............. 372/95 |

FOREIGN PATENT DOCUMENTS

| | | |
|---|---|---|
| CN | 1448000 A | 10/2003 |
| DE | 100 26 734 A1 | 12/2001 |
| DE | 100 40 450 A1 | 3/2002 |
| DE | 10 2004 015 446 A1 | 8/2005 |
| WO | WO 03/030316 A | 4/2003 |
| WO | WO 2005/048423 | 3/2005 |

* cited by examiner

LATERAL OPTICALLY PUMPED SURFACE-EMITTING SEMICONDUCTOR LASER ON A HEAT SINK

RELATED APPLICATIONS

This is a U.S. national stage of application No. PCT/DE2005/001655, filed on Sep. 20, 2005.

This patent application claims the priority of German patent application no. 10 2004 045 949.5 filed Sep. 22, 2004, the disclosure content of which is hereby incorporated by reference.

FIELD OF THE INVENTION

The invention relates to an optically pumped surface emitting semiconductor laser device and a method for producing such a semiconductor laser device.

BACKGROUND OF THE INVENTION

The document U.S. Pat. No. 5,991,318 describes an optically pumped vertical resonator semiconductor laser comprising a monolithically integrated surface emitting semiconductor layer structure. In the case of this known device, the optical pump radiation, the wavelength of which is smaller than that of the laser radiation generated, is supplied by an edge emitting semiconductor diode. The edge emitting semiconductor laser diode is arranged externally in such a way that the pump radiation is radiated obliquely from the front into the amplifying region of the surface emitting semiconductor layer structure. The disclosure content of the document U.S. Pat. No. 5,991,318 is hereby incorporated by reference.

The document U.S. Pat. No. 6,954,479 describes an optically pumped surface emitting semiconductor laser device comprising at least one radiation-generating quantum well structure and at least one pump radiation source. In this case, the pump radiation source serves for optically pumping the quantum well structure. The pump radiation source has an edge emitting semiconductor structure. The radiation-generating quantum well structure and the edge emitting semiconductor structure are grown epitaxially on a common substrate. The disclosure content of the document U.S. Pat. No. 6,954,479 is hereby incorporated by reference.

SUMMARY OF THE INVENTION

It is an object of the present invention to provide an optically pumped, surface emitting semiconductor laser device which is cooled particularly efficiently. It is furthermore an object of the invention to specify methods for producing such semiconductor laser devices.

A surface emitting semiconductor laser device is specified. In at least one embodiment, the semiconductor laser device contains at least one surface emitting semiconductor laser. The surface emitting semiconductor laser preferably contains a vertical emitter. The vertical emitter preferably comprises at least one surface emitting structure suitable for generating electromagnetic radiation. The surface emitting structure is particularly preferably a quantum well structure or a multi quantum well structure.

In the context of the application, the term quantum well structure encompasses any structure in which charge carriers undergo a quantization of their energy states as a result of confinement. In particular, the term quantum well structure does not comprise any indication about the dimensionality of the quantization. Consequently, it encompasses, inter alia, quantum wells, quantum wires and quantum dots and any combination of these structures.

In addition, the vertical emitter preferably contains a resonator comprising at least two resonator mirrors. The vertical emitter is particularly preferably suitable for generating laser radiation.

The surface emitting semiconductor laser furthermore preferably contains at least one pump radiation source which is suitable for optically pumping the vertical emitter. The pump radiation source is particularly preferably an edge emitting semiconductor laser structure. By way of example, the pump radiation source may be an edge emitting broad-stripe laser.

Pump radiation source and vertical emitter are preferably grown epitaxially on a common substrate. That is to say that pump radiation source and vertical emitter are preferably monolithically integrated alongside one another on a common substrate. The layer thicknesses of the individual semiconductor layers can be set very accurately during the epitaxy, with the result that a high positioning accuracy of the edge emitting structure with respect to the surface emitting structure is advantageously possible. In this case, the pump radiation source is preferably suitable for laterally pumping the vertical emitter. That is to say that the pump radiation runs essentially parallel to the surface of the common substrate onto which the semiconductor laser is deposited, and essentially perpendicular to the laser beam generated by the vertical emitter.

Furthermore, the surface emitting semiconductor laser device preferably contains a heat-conducting element. The heat-conducting element is preferably in thermal contact with the surface emitting semiconductor laser. That is to say that the heat-conducting element is preferably in thermal contact both with the pump radiation source or the pump radiation sources and the vertical emitter. In this case, the heat-conducting element permits dissipation of the heat generated during operation of the surface emitting semiconductor laser. In this case, the heat is preferably dissipated essentially by means of heat conduction. In this case, essentially by means of heat conduction means that other heat transfer mechanisms play at most a secondary part.

The heat-conducting element preferably has in addition a mounting area. In this case, the mounting area is provided for mounting the semiconductor laser device on a carrier. Particularly preferably, the heat arising during operation of the surface emitting semiconductor laser is dissipated by the heat-conducting element to the mounting area and from there can be emitted to the carrier. In this case, the carrier preferably acts in the sense of a heat sink. The mounting area may be situated for example on a surface of the heat-conducting element opposite to the semiconductor laser. The heat is then passed on from the surface emitting semiconductor laser preferably directly, i.e. without an appreciable lateral heat conduction taking place, to the mounting area.

In accordance with at least one embodiment, therefore, a surface emitting semiconductor laser device is specified which comprises at least one surface emitting semiconductor laser having a vertical emitter and at least one pump radiation source, which are monolithically integrated alongside one another on a common substrate. The surface emitting semiconductor laser device furthermore has a heat-conducting element, which is in thermal contact with the semiconductor laser, and a mounting area provided for mounting on a carrier.

In at least one embodiment of the surface emitting semiconductor laser device, the heat-conducting element is electrically conductive. That is to say that the heat-conducting element is either formed from an electrically conductive material or it contains an electrically insulating material, for example, on at least parts of the surface of which an electrically conductive material is situated. By way of example, the electrically insulating material may then be coated with an electrically conductive material.

The heat-conducting element is preferably suitable for making electrical contact with the semiconductor laser. For this purpose, the electrical conductivity of the heat-conducting element is advantageously particularly high, so that the heat-conducting element has only a very low electrical resistance. Preferably, the heat-conducting element is electrically contact-connected to the pump radiation source or the pump radiation sources of the surface emitting semiconductor laser, i.e. there is preferably an electrically conductive connection between, for example, the n-side contact of the pump radiation source and the heat-conducting element. However, the pump radiation source can also be contact-connected by the heat-conducting element on the p-side.

Particularly preferably, the heat-conducting element is electrically conductively connected to the carrier at its mounting area. In this way, the semiconductor laser is preferably electrically connected to the carrier via the heat-conducting element.

In accordance with at least one embodiment, the heat-conducting element preferably contains one of the following materials: copper, diamond, silver, $Al_2O_3$, AlN, SiC, BN, copper-diamond. If the heat-conducting element contains for example an electrically insulating material such as BN, for instance, then conductor tracks composed of an electrically conductive material are applied, for example printed, onto the material, and enable electrical contact to be made with the semiconductor laser from the mounting area of the heat-conducting element.

In at least one embodiment of the surface emitting semiconductor laser device, there is a thermally stable connection between heat-conducting element and semiconductor laser. That is to say that the connection between surface emitting semiconductor laser and heat-conducting element resists the temperatures generated during operation of the surface emitting semiconductor laser without losing its adhesive effect. In this case, the connection particularly preferably has particularly good thermal conductivity, so that the heat generated can be emitted to the heat-conducting element without appreciable heat accumulation in the region of the connection.

Furthermore, the connection is electrically conductive at least in the partial regions of the semiconductor laser in which there is a connection between the pump radiation source and the heat-conducting element.

The connection may be a solder connection, for example. For this purpose, the solder may contain at least one of the following materials: Au, Sn, In, SnAg, AuSn, Ge, AuGe. That is to say that both soft soldering and brazing are appropriate. However, it is also possible for there to be a galvanic connection between heat-conducting element and semiconductor laser. That is to say that between heat-conducting element and semiconductor laser there may be a connection produced by means of an electrodeposition process.

In at least one embodiment of the surface emitting semiconductor laser device, the surface emitting semiconductor laser is connected to the heat-conducting element at its surface remote from the substrate. That is to say that the surface emitting semiconductor laser is mounted onto the surface of a heat-conducting element for example in the sense of an upside down mounting method. By way of example, in this case the laser can be soldered onto the surface of the heat-conducting element. It is particularly advantageous that the heat generated during operation for example in a radiation-generating layer of the pump radiation source can be conducted away to the heat-conducting element via a particularly short path. The proximity of the active layer to the heat-conducting element therefore advantageously improves the cooling of the surface emitting semiconductor laser. In this case, it is furthermore possible for the substrate remote from the heat-conducting element to be thinned or completely removed. That is to say that the thickness of the substrate can be reduced for example by grinding away, etching or laser ablation to an extent such that there is no longer any substrate present.

In accordance with at least one embodiment of the surface emitting semiconductor laser device, the substrate contains at least one recess which contains the heat-conducting element. Through said recess, the heat-conducting element can be attached particularly close to the location of the greatest evolution of heat. In this case, the recess is preferably formed in such a way that it is possible to make electrical contact with the semiconductor laser via the heat-conducting element. That is to say that the substrate is removed to an extent such that the heat-conducting element can be contact-connected to the semiconductor laser either directly or via a thin substrate layer, for example. Heat-conducting element and semiconductor laser are preferably in electrical contact with one another in any case.

Preferably, the recess is etched into the substrate for example in a defined manner. However, it is also possible for the recess to be produced in some other way, for example mechanically.

In at least one embodiment of the surface emitting semiconductor laser device, the heat-conducting element is electrodeposited into the recess of the substrate. The size and form of the heat-conducting element are then essentially predetermined by the size and form of the recess. Preferably, the heat-conducting element completely fills the recess. By way of example, the heat-conducting element terminates essentially flush with that surface of the substrate which is remote from the surface emitting semiconductor laser. However, it is also possible for a thin layer of the electrodeposited material to cover at least parts of said surface. An advantage afforded by this embodiment is that the galvanic layers can be deposited into the recess of the substrate at room temperature. Dispensing with a connecting technique such as soldering, for instance, considerably reduces the thermal stress on the component during the production process. In this case, by way of example, all metals that can be electrodeposited are considered as possible materials for the heat-conducting element. The heat-conducting element particularly preferably contains silver, gold and/or copper.

In at least one embodiment of the surface emitting semiconductor laser device, the pump radiation source has at least one etched resonator facet. Preferably, the laser facets of the pump radiation sources are mirror-coated with a metal, for example. The laser facets preferably extend perpendicular to the pump radiation, i.e. perpendicular to the resonator of the edge emitter, and are preferably formed by planar areas.

A method for producing a surface emitting semiconductor laser device is furthermore specified.

In at least one embodiment of the method, firstly a semiconductor wafer is provided, having a multiplicity of surface emitting semiconductor lasers. Preferably, the semiconductor lasers in each case have a vertical emitter and at least one pump radiation source. Vertical emitter and pump radiation source are preferably monolithically integrated alongside one another on a common substrate.

In a next method step, a heat-conducting disc is provided. The heat-conducting disc preferably contains at least one of the following materials: copper, copper-diamond, $Al_2O_3$, AlN, SiC, diamond, BN, metal.

Particularly preferably, form and size of the semiconductor wafer and heat-conducting disc are matched to one another, i.e. the heat-conducting disc is preferably at least as large as the semiconductor wafer. Particularly preferably both the wafer and the disc have the same form and are circular, for example.

In the subsequent method step, semiconductor wafer and heat-conducting element are connected to one another. For this purpose, the surface emitting semiconductor lasers are preferably connected to the heat-conducting disc at their surface remote from the substrate. The semiconductor wafer is therefore mounted onto the heat-conducting disc in the manner of upside down mounting. The heat-conducting disc is preferably electrically conductive at least in some places, so that electrical contact can be made with the semiconductor lasers via the heat-conducting disc.

In order to make the vertical emitter accessible to an external resonator, for example, the next method step may involve effecting a trench etching in the substrate, during which the vertical emitters are in each case uncovered.

A subsequent method step involves effecting separating cuts or particularly preferably separating etches through the semiconductor wafer. The separations preferably run perpendicular to the substrate through the pump radiation sources, so that facets of the edge emitting pump radiation sources arise. In this case, the facets are preferably perpendicular to the resonator of the pump radiation source and are plane. For better efficiency of the pump radiation source, it is advantageous for the facets subsequently to be mirror-coated, for example by introducing a highly reflective metal into the separating trenches.

In the subsequent method step, the compound comprising semiconductor wafer and heat-conducting disc is singulated along the separations, so that a multiplicity of surface emitting semiconductor laser devices arise.

Particularly preferably, the singulation is effected firstly in one direction in each case, so that a plurality of strips with surface emitting semiconductor laser devices connected in series arise. These can be operated simultaneously for a burn-in operating mode.

In accordance with at least one embodiment of the method, it is possible for the surface emitting semiconductor lasers to be singulated prior to connection to the heat-conducting disc. In this way, it is possible to check the functionality of the individual surface emitting semiconductor lasers prior to mounting onto the often expensive heat-conducting element material.

The resonator trench etching and the production of the pump radiation source facets by means of, for example, etching and mirror-coating may be effected both before and after the mounting of the surface emitting semiconductor lasers onto the heat-conducting disc. The surface emitting semiconductor lasers can be connected to one another by means of wire contacts, so that a common burn-in operating mode is possible in this embodiment, too.

In accordance with at least one embodiment of the method for producing a surface emitting semiconductor laser device, firstly a substrate is provided, on which a multiplicity of surface emitting semiconductor lasers each having a vertical emitter and at least one pump radiation source are monolithically integrated alongside one another.

In the next method step, at least one recess is produced per semiconductor laser on the side of the substrate opposite to the semiconductor laser by means of an etching process. In this case, the recess preferably extends to such a depth into the substrate and is laterally extended to such a degree that all the pump radiation sources of a semiconductor laser are accessible for contact-connection. As an alternative, it is possible for at least one recess via which the pump radiation source is accessible for electrical contact-connection to be additionally formed per pump radiation source.

In the subsequent method step, a heat-conducting material is electrodeposited into the recess of the substrate. The heat-conducting material is preferably distinguished by a both thermally and electrically very good conductivity, so that both a thermal and an electrical connection of the semiconductor laser are possible by means of the heat-conducting material.

In a final method step, the arrangement comprising semiconductor laser and heat-conducting elements is singulated to form surface emitting semiconductor laser devices which in each case have a semiconductor laser device and at least one heat-conducting element.

In at least one embodiment of the method, the resonator trench etching may advantageously be omitted since the vertical emitter can emit through the surface of the surface emitting semiconductor laser which is remote from the substrate. The facets of the pump radiation sources can be produced by etching and subsequent mirror-coating. However, it is also possible for the facets of the pump radiation sources to be produced for example by scribing of the arrangement and breaking with subsequent mirror-coating of the facets of the individual surface emitting semiconductor laser devices. A common burn-in operating mode of at least parts of the surface emitting semiconductor laser devices is also possible in the manner described further above.

The surface emitting semiconductor laser device described here is explained in more detail below on the basis of exemplary embodiments and the associated figures.

In the exemplary embodiments and figures, identical or identically acting component parts are in each case provided with the same reference symbols. The component parts illustrated and also the size relationships among the component parts should not be regarded as true to scale. Rather, some details of the figures are illustrated with an exaggerated size in order to afford a better understanding.

Figure 1:
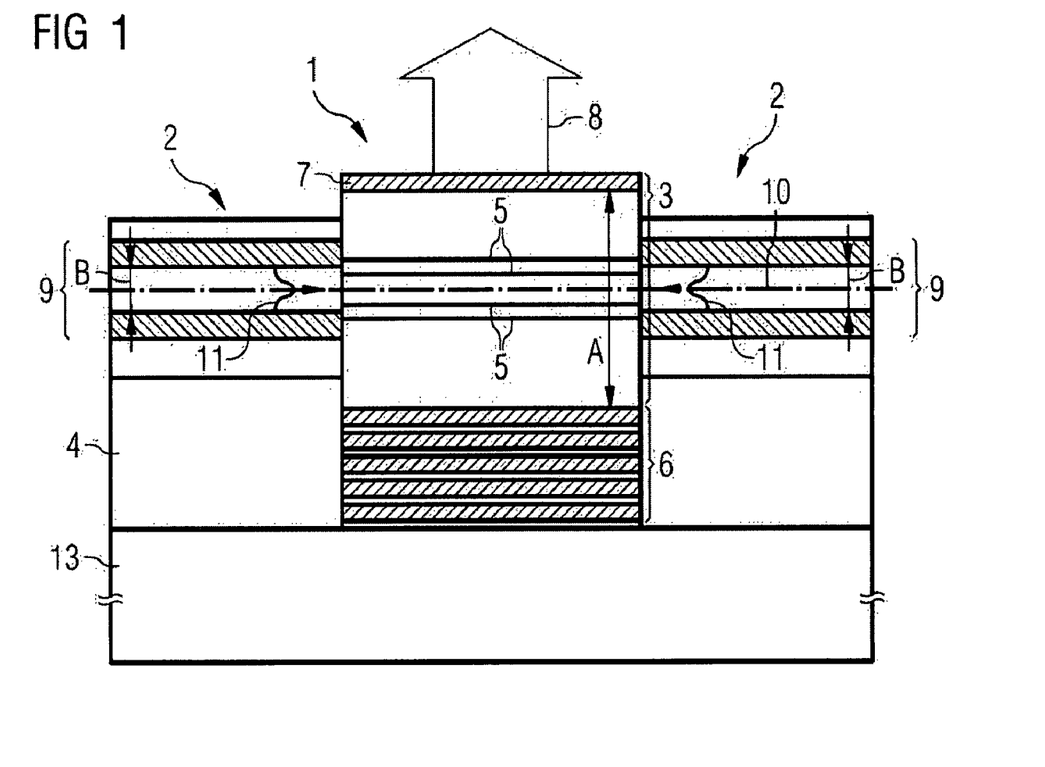
FIG. 1 shows a schematic sectional illustration of a first exemplary embodiment of the surface emitting semiconductor laser described here.

The surface emitting semiconductor laser illustrated in FIG. 1 comprises a vertical emitter 1 and a pump radiation source 2.

The vertical emitter 1 has a central waveguide 3 and also a radiation-generating quantum well structure arranged within the central waveguide 3 and having a plurality of quantum layers 5. A mirror 6 is disposed upstream of the central waveguide in the vertical direction. Said mirror is preferably embodied as a Bragg minor having a multiplicity of alternate layers having different refractive indices. Opposite the mirror, a coupling-out layer 7 is applied to the central waveguide 3 on the side remote from the substrate 13, the radiation 8 generated by the vertical emitter being coupled out through said coupling-out layer.

The mirror 6 together with an external mirror (not illustrated) may form an external laser resonator for the vertical emitter. A device of this type is also referred to as a VECSL (Vertical External Cavity Surface Emitting Laser). As an alternative, a partially reflecting coupling-out mirror, preferably a Bragg mirror, may be arranged between coupling-out layer 7 and central waveguide 3 in order to form an internal resonator in the manner of a VCSEL (Vertical Cavity Surface Emitting Laser).

Furthermore, in an external laser resonator, it is possible to arrange a non-linear optical element, for example a non-linear crystal, for frequency conversion purposes. This embodiment is advantageous for a frequency conversion, in particular a frequency multiplication such as a frequency doubling, for instance, of the radiation 8 generated by the quantum well structure. This embodiment of the surface emitting semiconductor laser may likewise be used for other non-linear conversions such as, for example, summation frequency generation, difference frequency generation, generation of subharmonics, Raman scattering or four-wave mixing, the radiation field generated by the vertical emitter optionally being superposed with a further, e.g. externally generated radiation field in the non-linear optical element.

The two pump radiation sources 2 arranged laterally in each case comprise an active layer and also a pump waveguide 9 having a center axis 10, into which the pump radiation 11 is guided. As indicated in FIG. 1, the pump radiation 11 preferably has an approximately Gaussian profile. Furthermore, a buffer layer 4 may be provided in order to position the pump waveguides in the vertical direction at a suitable level with respect to the central waveguide.

The quantum layers 5 are arranged at a predetermined distance from the center axis 10.

Pump radiation sources 2 and vertical emitter 1 are preferably monolithically integrated, i.e. grown epitaxially onto a common substrate 13. Pumped radiation sources 2 can be pump lasers. After production, said substrate 13 can be thinned or else completely removed. As an alternative, the minor 6 is applied on the top side of the central waveguide 3. Radiation is then coupled out through the substrate 13 on the opposite side to the mirror. Preferably, a trench etching that enables the radiation to be coupled out is then present in the substrate 13 in the region of the vertical emitter 1.

Moreover, it is possible for more than two pump radiation sources 2, for example four or six pump radiation sources 2, to optically pump the vertical emitter 1. The pump radiation sources 2 may then be arranged in cross- or star-shaped fashion around the vertical emitter 1.

During operation, the pump radiation generated by the pump radiation sources 2 is coupled laterally into the quantum well structure and absorbed in the quantum layers 5 and thus excites the emission of the radiation 8 (optical pumping). In the case where the vertical emitter is configured as a laser, the quantum well structure serves as an optically pumped active medium in which the laser radiation is generated or amplified by stimulated emission.

In this exemplary embodiment, the width A of the central waveguide 3 is greater than the width B of the pump waveguide 9 and is adapted to the latter in such a way that the quantum well structure of the vertical emitter 1 is pumped uniformly and preferably in large-area fashion. Specifically, in the case of the exemplary embodiment shown in FIG. 1, this is achieved by means of beam expansion of the pump radiation and by means of the quantum layers 5 being arranged at a distance from the center axis 10 of the pump waveguides 9.

The beam expansion is based on the diffraction of the pump radiation field 11 after transition from the pump waveguide 9 into the significantly wider central waveguide 3. In this case, the number of modes in the central waveguide is so high that approximately a free propagation of the pump radiation in the central waveguide can be assumed. The profile of the pump radiation can be determined in the context of Gaussian optics.

Figure 2:
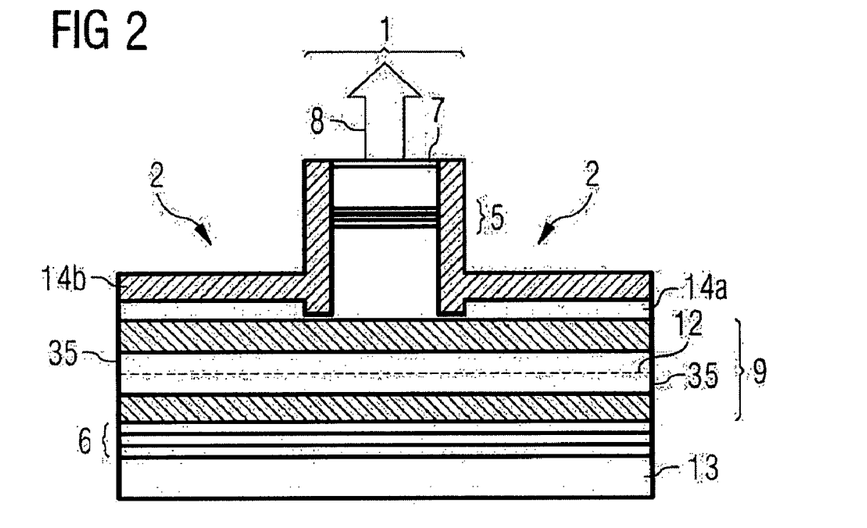
FIG. 2 shows a schematic sectional illustration of a second exemplary embodiment of the surface emitting semiconductor laser described here.

FIG. 2 shows a schematic sectional illustration of a second exemplary embodiment of the surface emitting semiconductor laser described here.

A disc laser grown by means of a single-step epitaxy is shown here, in which laser the pump radiation 8 is coupled upward, as viewed from a center axis 12 of the pump waveguide 9, into the quantum well structure 5 of the surface emitting laser, which structure contains a multiplicity of quantum wells, for example. In this case, the coupling into the quantum well structure 5 is effected for example on the basis of jumps in the refractive index of the pump waveguide 9. The pump radiation sources 2 are optically coupled edge emitters, for example. The laser facets 35 of the pump lasers 2 are preferably produced by scribing and breaking along the crystallographic axis of the substrate 13 and subsequent mirror-coating with high reflectivity (R>90%). As an alternative, the facets are formed by etching and subsequent, minor-coating.

On account of the mirror-coating with high reflectivity, at most a small portion of the pump radiation 8 is coupled out from the lateral resonator. By means of the resonator-internal surface emitting laser 1 with mirror 6, an efficient optical pump mechanism is realized by the absorption of the pump radiation in the quantum well structure 5.

In this case, the advantage of this exemplary embodiment resides in the particularly simple embodiment in terms of production engineering. After the epitaxy, in the region of the pump laser 2, etching is effected into the waveguide by selective etching in a defined manner by means of an etching stop layer and this is followed by the application of a transparent conductive p-type contact 14a, which may contain a zinc oxide, for example, and a p-type contact metallization 14b, which preferably also serves as a metallic reflector for the pump light 11.

Figure 3:
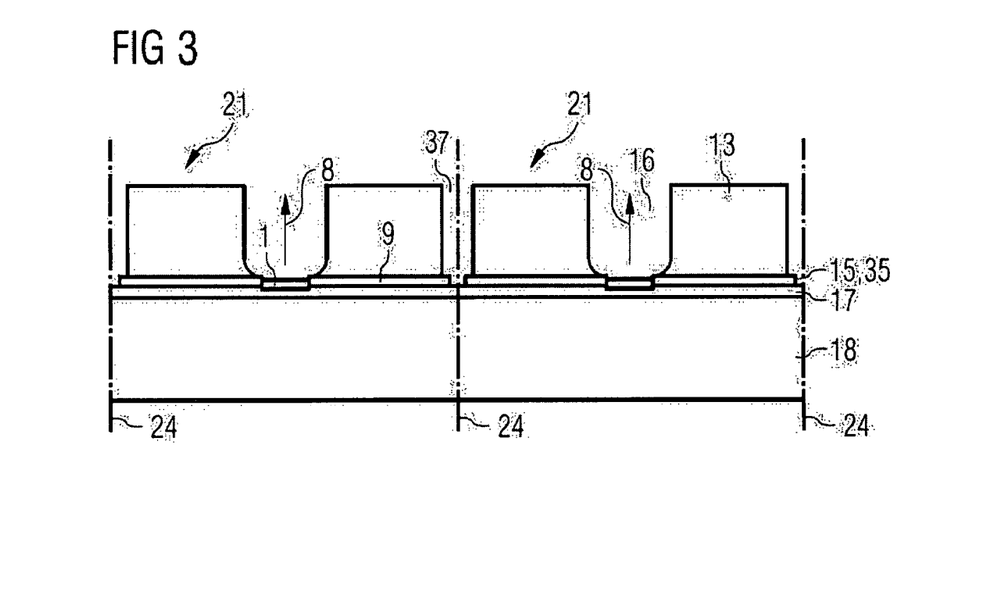
FIG. 3 shows a schematic sectional illustration of a first exemplary embodiment of the surface emitting semiconductor laser device described here.

FIG. 3 shows a schematic sectional illustration of a first exemplary embodiment of the surface emitting semiconductor laser device described here.

The semiconductor lasers 21—such as are described for example in FIG. 1 or 2—are applied here as a wafer onto a heat-conducting disc 18, which forms the heat-conducting element after the singulation of the arrangement. By way of example, the wafer and disc are mechanically connected to one another by means of a solder layer 17. Moreover, the pump radiation sources 9 of the semiconductor lasers are electrically contact-connected to the heat-conducting disc 18 by means of the solder layer 17.

For this purpose, the heat-conducting disc 18 is preferably electrically conductive, so that it is possible to make electrical contact with the pump radiation sources 9 via the heat-conducting disc 18. In this case, the heat-conducting disc 18 contains an electrically conductive material, for example, or is at least partly coated in an electrically conductive fashion. Possible materials for the disc 18 and hence for the heat-conducting element are copper, copper-diamond composite material, diamond, silver, $Al_2O_3$, AlN, SiC, BN or combinations of said materials. The solder layer 17 preferably contains at least one of the following materials or material combinations: In, Sn, SnAg, Ag, Au, AuSn, AuGe. In order to make the vertical emitter 1 accessible to an external resonator (not illustrated), a resonator trench etching 16 is effected, through which the radiation 8 of the vertical emitter 1 can emerge.

Separating cuts or separating etches 37 through the substrate 13 and the pump radiation sources 9 are performed during the singulation along the lines 24 of the compound comprising semiconductor laser and the heat-conducting disc 18. The pump radiation sources 9 are preferably mirror-coated at the separating areas 15 for laser operation. Preferably, in this case the separating areas 15 are perpendicular to the resonator of the pump radiation source 9 and are formed in planar fashion. The separating areas 15 thus form the laser facets 35 of the pump radiation sources 9.

In order to separate single laser devices, separating cuts have to be effected along lines which run in two directions, e.g., horizontal and vertical lines. If the separating cuts or separating etches 37 are effected firstly only in one direction, then the semiconductor laser devices can in each case be operated in parallel for a burn-in.

Moreover, it is possible for the resonator trench etching 16 and the mirror-coating of the separating areas 15 to be effected only after the singulation of the compound to form surface emitting semiconductor laser devices each having a semiconductor laser and a heat-conducting element.

Figure 4:
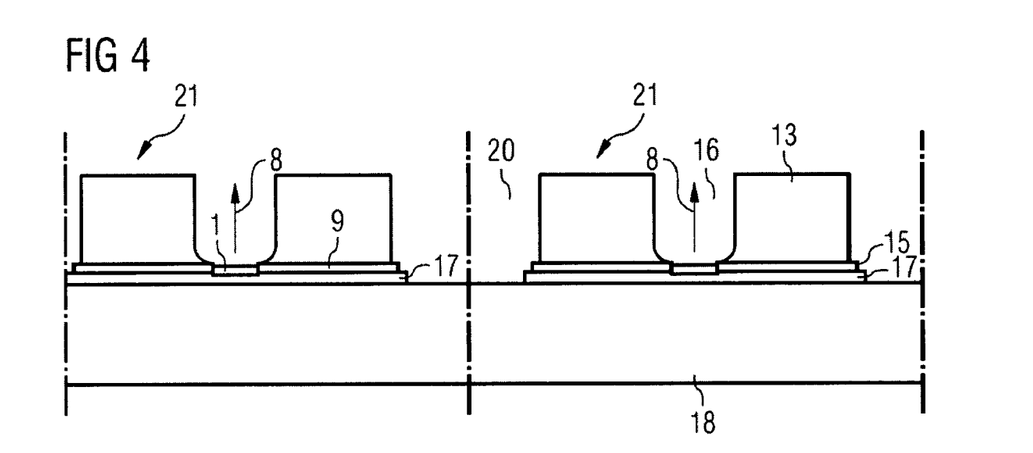
FIG. 4 shows a schematic sectional illustration of a second exemplary embodiment of the surface emitting semiconductor laser device described here.

FIG. 4 shows a schematic sectional illustration of a second exemplary embodiment of the semiconductor laser device described here.

In contrast to the previous exemplary embodiment, the semiconductor lasers 21 are in this case not applied to the heat-conducting disc 18 while in the wafer compound, but rather individually by means of, for example, a die bonding method with a distance 20 between the individual semiconductor lasers 21. An advantage of this method is that semiconductor lasers 21 that have already been checked with regard to their functionality are applied to the heat-conducting disc 18 and the rejects during the production of the semiconductor laser device can thereby advantageously be reduced. In order to carry out a burn-in, the semiconductor lasers 21 on the disc 18 can be connected to one another by means of wire contacts.

The trench etching 16 can be effected before or after connection. The production of the pump laser facets at the separating areas 15 can be effected before and after mounting onto the heat-conducting disc 18. A joint burn-in of the semiconductor laser devices can be carried out by means of interconnecting the semiconductor laser devices by means of wire contacts.

Figure 5:
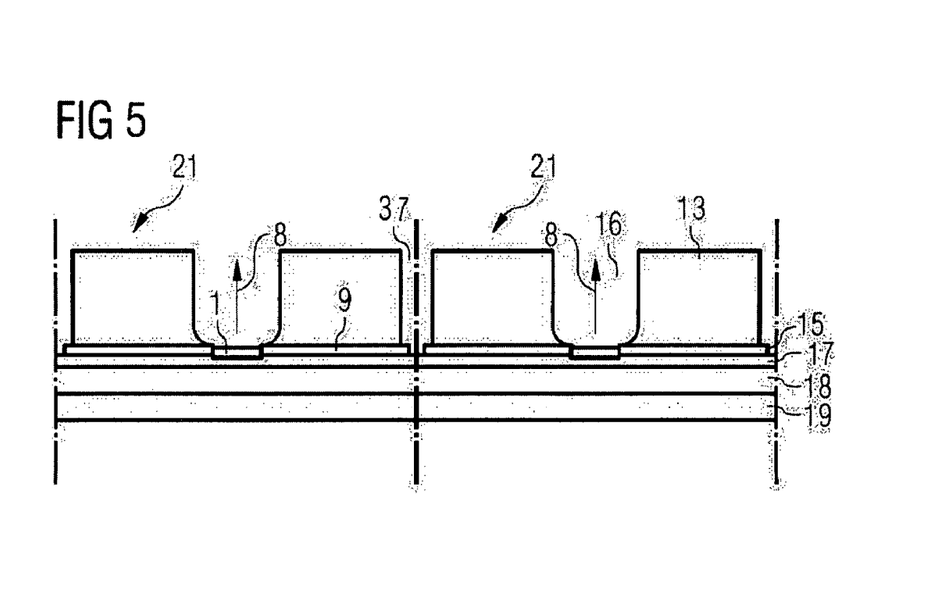
FIG. 5 shows a schematic sectional illustration of a third exemplary embodiment of the surface emitting semiconductor laser device described here.

FIG. 5 shows a schematic sectional illustration of a third exemplary embodiment of the semiconductor laser device described here. In this case, the semiconductor lasers 21 are adhesively bonded onto a separating film 19 reinforced by a metal layer 18. The metal layer 18 contains gold, for example, and is between 20 and 30 µm thick. The separating film 19 is provided by an adhesive film, by way of example.

Figure 6:
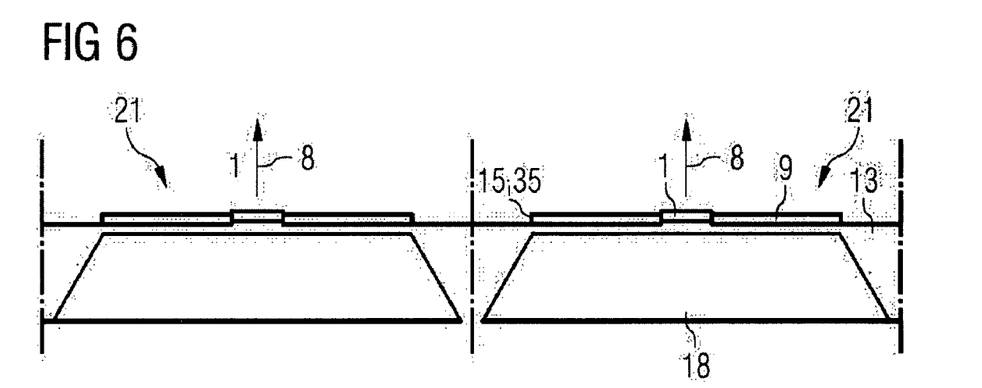
FIG. 6 shows a schematic sectional illustration of a fourth exemplary embodiment of the surface emitting semiconductor laser device described here.

FIG. 6 shows a schematic sectional illustration through a fourth exemplary embodiment of the surface emitting semiconductor laser device described here.

In this case, recesses are etched into the substrate 13 from the side remote from the surface emitting semiconductor lasers 21, layers that form the heat-conducting element 18 being electrodeposited into said recesses. In this case, the heat-conducting element 18 preferably contains gold, silver or copper. The vertical emitter 1 and the pump radiation sources 9 are situated on the top side of the component. A resonator trench etching can thus be omitted. The separating areas 15 can be produced either by etching or scribing and breaking. Afterwards, they are coated in order to produce resonator mirrors. A further advantage that arises is that the electrodeposition process can take place at room temperature. This makes it possible to deposit galvanic layers such as, for example, silver layers having a very high thermal conductivity, the coefficients of thermal expansion of which are not adapted to the substrate material—for example GaAs. If, instead of the electrodeposition, a solder method were used for mounting onto the heat-conducting element, then this could lead, at the customary soldering temperatures of at least 100 degrees Celsius, to considerable thermal strains in the—for example thinned—approximately 7 µm thick semiconductor laser 21 having edge dimensions of approximately 1 mm by 1 mm (variations of 0.05 to 5 mm are possible).

Figure 7:
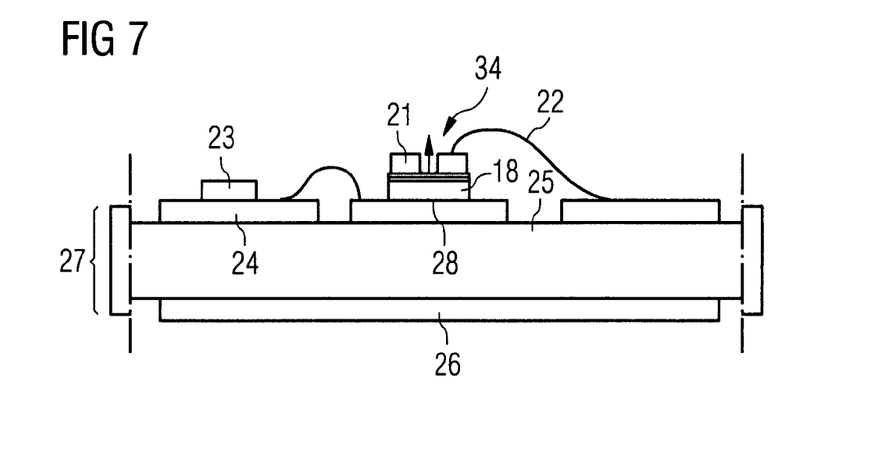
FIG. 7 shows a schematic sectional illustration of an exemplary embodiment of the surface emitting semiconductor laser device described here on a carrier.

FIG. 7 shows a schematic sectional illustration of one of the above-described surface emitting semiconductor laser devices 34 comprising the semiconductor laser 21 and the heat-conducting element 18, which is mounted onto a carrier 27. The carrier 27 is a panel, for example, i.e. a planar substrate having two-dimensionally recurring structures. The surface emitting semiconductor laser device 34 is mounted onto the carrier 27 for example by means of a connecting technique such as soldering. In this case, the carrier may contain further components such as, for example, optical components or temperature measuring resistors 23. Examples of appropriate carriers with a metal 24, non-metal 25, metal 26 construction include the following structures: direct bonded copper (DBC), Cu—AlN—Cu, Cu—$Al_2O_3$—Cu, Cu—Si—Cu. For electrical contact-connection, the surface emitting semiconductor laser device 34 can be connected to the carrier 27 by means of bonding wires 22.

In this case, the carrier is preferably distinguished by a particularly good thermal conductivity, so that the heat from the heat-conducting element 18 can be taken up by the carrier 27 particularly well via the mounting area 28.

Figure 8:
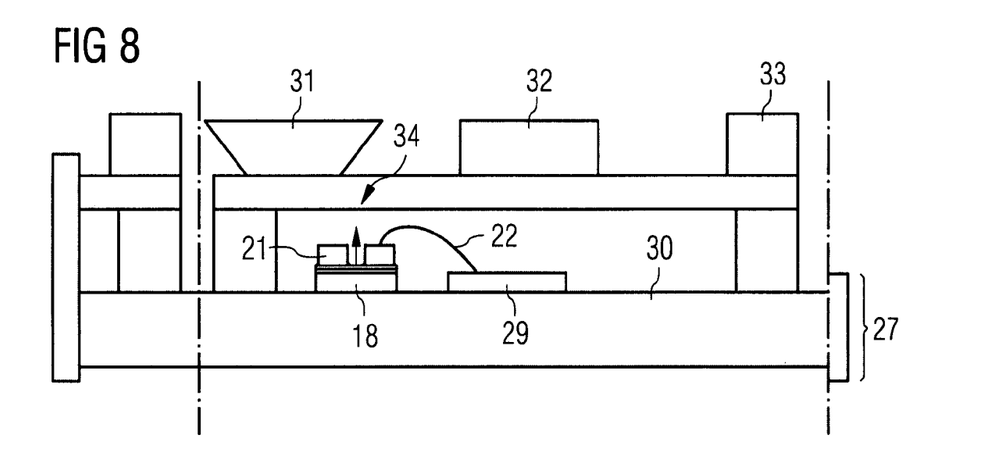
FIG. 8 shows a schematic sectional illustration of a further exemplary embodiment of the surface emitting semiconductor laser device described here on a carrier.

FIG. 8 shows the mounting of the surface emitting semiconductor laser device on a carrier 27 that does not have a sandwich construction. By way of example, the carrier may contain one or more of the following materials: Al, Cu, CuW, Ag, SiC, $Al_2O_3$, AlN, BN, SiC.

If the carrier 27 in this case contains materials having no or poor electrical conductivity, the carrier 27 may have for example a thin-film or a thick-film metallization 30. By way of example, a printed circuit board 29 or a printed-circuit-board-like arrangement 29 may be applied to a metallic carrier 27. In addition, the arrangement illustrated also has an optical prism assembly (OPA). The assembly may contain for example a prism or a beam splitter 31, a non-linear material for frequency conversion 32 and a resonator mirror 33.

The invention is not restricted by the description on the basis of the exemplary embodiments. Thus, the heat-conducting element described here is not restricted to the use with semiconductor lasers, rather it is also possible for other optoelectronic semiconductor components such as light-emitting diodes or photodiodes to be mounted onto the heat-conducting elements described here for example by means of the methods described here. The invention encompasses any new feature and also any combination of features, which in particular comprises any combination of features in the patent claims, even if this feature or this combination itself is not explicitly specified in the patent claims or exemplary embodiments.

The invention claimed is:

1. A surface emitting semiconductor laser device, comprising:
    at least one surface emitting semiconductor laser having a vertical emitter and at least one pump radiation source, which are monolithically integrated alongside one another onto a common substrate, and
    a heat-conducting element, which is in thermal contact with the semiconductor laser and has a mounting area provided for mounting on a carrier,
    wherein the substrate has at least one recess which contains the heat-conducting element.

2. The semiconductor laser device according to claim 1, in which the heat-conducting element is electrically conductive.

3. The semiconductor laser device according to claim 1 in which the heat-conducting element is suitable for making electrical contact with the semiconductor laser.

4. The semiconductor laser device according to claim 1, in which the heat-conducting element contains at least one of the following materials: copper, diamond, silver, $Al_2O_3$, MN, SiC, BN, copper-diamond.

5. The semiconductor laser device according to claim 1, in which there is a thermally stable adhesion between heat-conducting element and semiconductor laser.

6. The semiconductor device according to claim 1, in which the semiconductor laser is connected to the heat-conducting element at its surface remote from the substrate.

7. The semiconductor laser device according to claim 1, in which the recess is etched into the substrate.

8. The semiconductor laser device according to claim 1, in which the heat-conducting element is electrodeposited into the recess.

9. The semiconductor laser device according to claim 1, in which the pump radiation source has at least one etched resonator facet.

10. A surface emitting semiconductor laser device, comprising:
    at least one surface emitting semiconductor laser having a vertical emitter and at least one pump radiation source, which are monolithically integrated alongside one another onto a common substrate, and
    a heat-conducting element, which is in thermal contact with the semiconductor laser and has a mounting area provided for mounting on a carrier,
    wherein the pump radiation source has at least one etched resonator facet.

11. The semiconductor laser device according to claim 10, in which the heat-conducting element is electrically conductive.

12. The semiconductor laser device according to claim 10, in which the heat-conducting element is suitable for making electrical contact with the semiconductor laser.

13. The semiconductor laser device according to claim 10, in which the heat-conducting element contains at least one of the following materials: copper, diamond, silver, $Al_2O_3$, MN, SiC, BN, copper-diamond.

14. The semiconductor laser device according to claim 10, in which there is a thermally stable adhesion between heat-conducting element and semiconductor laser.

15. The semiconductor device according to claim 10, in which the semiconductor laser is connected to the heat-conducting element at its surface remote from the substrate.

16. The semiconductor laser device according to claim 10, in which the recess is etched into the substrate.

17. The semiconductor laser device according to claim 10, in which the heat-conducting element is electrodeposited into the recess.

* * * * *

UNITED STATES PATENT AND TRADEMARK OFFICE
CERTIFICATE OF CORRECTION

PATENT NO. : 7,817,695 B2  
APPLICATION NO. : 11/663617  
DATED : October 19, 2010  
INVENTOR(S) : Tony Albrecht Page 1 of 1

It is certified that error appears in the above-identified patent and that said Letters Patent is hereby corrected as shown below:

In the Claims

Column 11, line 27 (claim 4, line 3) and in Column 12, line 24 (claim 13, line 3) change "MN" to --AlN--

Signed and Sealed this
Seventeenth Day of September, 2013

Teresa Stanek Rea
*Deputy Director of the United States Patent and TrademarkOffice*